(12) United States Patent
Nishimura

(10) Patent No.: US 8,396,580 B2
(45) Date of Patent: Mar. 12, 2013

(54) INFORMATION PROCESSING APPARATUS, INFORMATION PROCESSING METHOD AND PROGRAM

(75) Inventor: Masaru Nishimura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 410 days.

(21) Appl. No.: 12/865,222

(22) PCT Filed: Dec. 17, 2008

(86) PCT No.: PCT/JP2008/072991
§ 371 (c)(1),
(2), (4) Date: Jul. 29, 2010

(87) PCT Pub. No.: WO2009/096110
PCT Pub. Date: Aug. 6, 2009

(65) Prior Publication Data
US 2010/0324701 A1    Dec. 23, 2010

(30) Foreign Application Priority Data

Feb. 1, 2008   (JP) .................................. 2008-023067

(51) Int. Cl.
*G06F 19/00* (2011.01)
(52) U.S. Cl. .......................................... 700/98; 700/121
(58) Field of Classification Search .................. 700/98, 700/101, 121, 244, 226; 422/67; 702/19, 702/182; 715/700
See application file for complete search history.

(56) References Cited

U.S. PATENT DOCUMENTS

| | | | | |
|---|---|---|---|---|
| 5,586,287 A | * | 12/1996 | Okumura et al. | 711/106 |
| 5,771,354 A | * | 6/1998 | Crawford | 709/229 |
| 6,256,750 B1 | * | 7/2001 | Takeda | 714/11 |
| 6,810,294 B2 | * | 10/2004 | Rangachari et al. | 700/97 |
| 6,906,811 B1 | * | 6/2005 | Teradaira et al. | 358/1.13 |
| 7,870,446 B2 | * | 1/2011 | Kurashige | 714/723 |

FOREIGN PATENT DOCUMENTS

| | | |
|---|---|---|
| JP | 2002-025997 A | 1/2002 |
| JP | 3543996 B2 | 4/2004 |
| JP | 2004-517495 A | 6/2004 |
| JP | 2005-520324 A | 7/2005 |
| JP | 2006-501680 A | 1/2006 |
| JP | 2007-180582 A | 7/2007 |
| JP | 2007-250570 A | 9/2007 |
| WO | 02/054481 A2 | 7/2002 |
| WO | 03/077049 A1 | 9/2003 |
| WO | 2004/031875 A1 | 4/2004 |

OTHER PUBLICATIONS

International Search Report for PCT/JP2008/072991 dated Feb. 24, 2009.

* cited by examiner

*Primary Examiner* — Kidest Bahta
(74) *Attorney, Agent, or Firm* — Pearne & Gordon LLP

(57) ABSTRACT

An information processing apparatus includes: a screen configuration unit 102 which configures a screen for receiving synchronization specifying information specifying whether each of the commands, of which a process sequence is specified, stored in a command storage unit 101 is executed in synchronization with or in asynchronization with other commands; a screen output unit 103 that outputs the configured screen; a specifying information receiving unit 104 that receives the synchronization specifying information through the outputted screen; and a command execution unit 106 which executes the commands stored in the command storage unit 101 according to the process sequence so as to execute a command specified to be synchronously executed after an execution end of an immediately previous command and a command specified to be asynchronously executed without waiting for an execution end of an immediately previous command with reference to the synchronization specifying information.

5 Claims, 7 Drawing Sheets

FIG. 5

| ID | MACRO NAME | SEQUENCE | DEVICE | COMMAND |
|---|---|---|---|---|
| 001 | FIRST PROCESS | 1 | DRP1 | START |
| 002 | FIRST PROCESS | 2 | VB1-P1 | OPEN |
| 003 | FIRST PROCESS | 3 | VB2-P1 | OPEN |
| 004 | FIRST PROCESS | 4 | TMP1 | START |
| 005 | FIRST PROCESS | 5 | TMP2 | START |
| 006 | FIRST PROCESS | 6 | VB3-P1 | OPEN |
| 007 | SECOND PROCESS | 1 | DRP1 | START |
| ⋮ | ⋮ | ⋮ | ⋮ | ⋮ |

FIG. 6

[MACRO NAME]     DECIDE

| PROCESS SEQUENCE | DEVICE NAME | COMMAND NAME | SYNCHRONIZATION | ASYNCHRONIZATION |
|---|---|---|---|---|
| [SEQUENCE] | [DEVICE NAME] | [COMMAND] | ☐ | ☐ |
|  |  |  |  |  |
|  |  |  |  |  |
|  |  |  |  |  |
|  |  |  |  |  |
|  |  |  |  |  |
|  |  |  |  |  |

FIG. 7

FIRST PROCESS     DECIDE

| PROCESS SEQUENCE | DEVICE NAME | COMMAND NAME | SYNCHRONIZATION | ASYNCHRONIZATION |
|---|---|---|---|---|
| 1 | DRP1 | START | ☐ | ☐ |
| 2 | VB1-P1 | OPEN | ☐ | ☐ |
| 3 | VB2-P1 | OPEN | ☐ | ☐ |
| 4 | TMP1 | START | ☐ | ☐ |
| 5 | TMP2 | START | ☐ | ☐ |
| 6 | VB3-P1 | OPEN | ☐ | ☐ |

FIG. 8

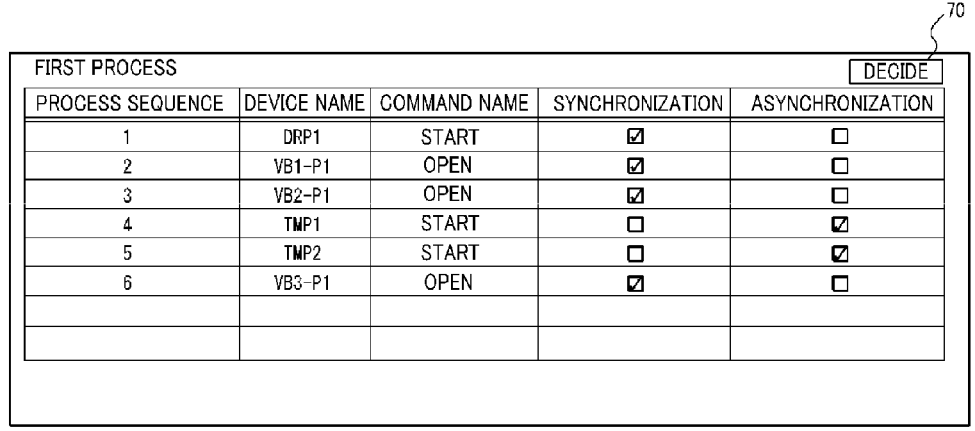

| FIRST PROCESS | | | | DECIDE |
|---|---|---|---|---|
| PROCESS SEQUENCE | DEVICE NAME | COMMAND NAME | SYNCHRONIZATION | ASYNCHRONIZATION |
| 1 | DRP1 | START | ☑ | ☐ |
| 2 | VB1-P1 | OPEN | ☑ | ☐ |
| 3 | VB2-P1 | OPEN | ☑ | ☐ |
| 4 | TMP1 | START | ☐ | ☑ |
| 5 | TMP2 | START | ☐ | ☑ |
| 6 | VB3-P1 | OPEN | ☑ | ☐ |
| | | | | |
| | | | | |

FIG. 9

| ID | SYNCHRONIZATION | ASYNCHRONIZATION |
|---|---|---|
| 001 | 1 | — |
| 002 | 1 | — |
| 003 | 1 | — |
| 004 | — | 1 |
| 005 | — | 1 |
| 006 | 1 | — |

FIG. 10

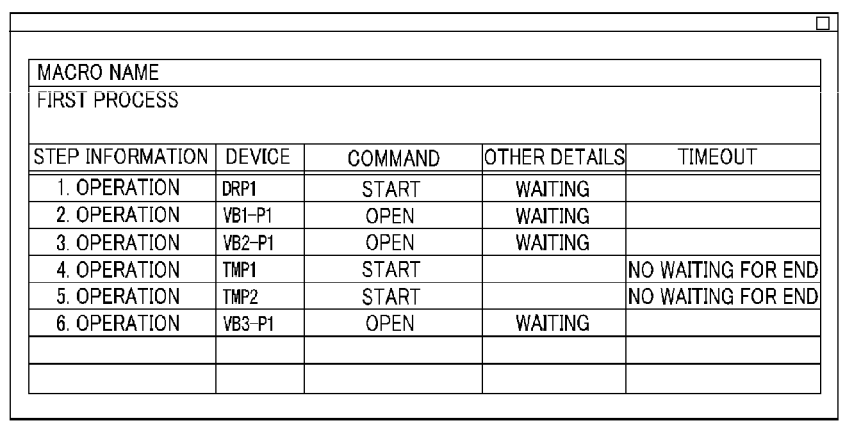

| MACRO NAME | | | | |
|---|---|---|---|---|
| FIRST PROCESS | | | | |
| STEP INFORMATION | DEVICE | COMMAND | OTHER DETAILS | TIMEOUT |
| 1. OPERATION | DRP1 | START | WAITING | |
| 2. OPERATION | VB1-P1 | OPEN | WAITING | |
| 3. OPERATION | VB2-P1 | OPEN | WAITING | |
| 4. OPERATION | TMP1 | START | | NO WAITING FOR END |
| 5. OPERATION | TMP2 | START | | NO WAITING FOR END |
| 6. OPERATION | VB3-P1 | OPEN | WAITING | |
| | | | | |
| | | | | |

INFORMATION PROCESSING APPARATUS, INFORMATION PROCESSING METHOD AND PROGRAM

TECHNICAL FIELD

The present invention relates to an information processing apparatus used in a semiconductor manufacturing process using a manufacturing apparatus.

BACKGROUND ART

Conventionally, there has been a semiconductor manufacturing apparatus displaying status of the apparatus and a command on the same screen in module unit and, thus, the command can be inputted while watching status of the apparatus (see, for example, Patent Document 1).

Further, as a conventional manufacturing apparatus, there has been a so-called vertical batch type heat treatment apparatus (see, for example, Patent Documents 2 and 3).

Patent Document 1: Japanese Patent Laid-open Publication No. 2007-180582 (see page 1 and FIG. 1)
Patent Document 2: Japanese Patent No. 3543996 (see page 1 and FIG. 1)
Patent Document 3: Japanese Patent Laid-open Publication No. 2002-25997 (see page 1 and FIG. 1)

DISCLOSURE OF THE INVENTION

Problems to be Solved by the Invention

However, in a conventional information processing apparatus, there is a need to produce a control program in order to sequentially execute processes by combining a synchronously executable command and an asynchronously executable command such as a command executable in parallel. Therefore, it is not easy for a user to execute a desired process by freely combining one or more commands.

Means for Solving the Problems

In accordance with the present invention, there is provided an information processing apparatus including: a command storage unit that stores one or more commands of which a process sequence is specified; a synchronization specifying information storage unit that stores synchronization specifying information specifying whether each of the commands stored in the command storage unit is executed in synchronization with or in asynchronization with other commands; and a command execution unit which executes the commands stored in the command storage unit according to the process sequence so as to execute a command specified to be synchronously executed after an execution end of an immediately previous command and a command specified to be asynchronously executed without waiting for an execution end of an immediately previous command with reference to the synchronization specifying information stored in the synchronization specifying information storage unit.

With this configuration, by storing information specifying whether to execute a command in synchronization with or in asynchronization with other commands, a user does not need to describe a program for performing a synchronous control or an asynchronous control when executing a desired process by combining a synchronously executable command and an asynchronously executable command. Accordingly, it is possible for the user to easily specify and execute a desired process by combining a synchronously executable command and an asynchronously executable command.

In accordance with the present invention, there is provided an information processing apparatus including: a command storage unit that stores one or more commands of which a process sequence is specified; a screen configuration unit which configures a screen for receiving synchronization specifying information specifying whether each of the commands stored in the command storage unit is executed in synchronization with or in asynchronization with other commands; a screen output unit that outputs the screen configured by the screen configuration unit; a specifying information receiving unit that receives the synchronization specifying information on each command through the screen outputted by the screen output unit; and a command execution unit which executes the commands stored in the command storage unit according to the process sequence so as to execute a command specified to be synchronously executed after an execution end of an immediately previous command and a command specified to be asynchronously executed without waiting for an execution end of an immediately previous command with reference to the synchronization specifying information received by the specifying information receiving unit.

With this configuration, by inputting information specifying whether to execute a command in synchronization with or in asynchronization with other commands, a user does not need to describe a program for performing a synchronous control or an asynchronous control when executing a desired process by combining a synchronously executable command and an asynchronously executable command. Accordingly, it is possible for the user to easily specify and execute a desired process by combining a synchronously executable command and an asynchronously executable command.

Further, since the information specifying whether to execute a command in synchronization with or in asynchronization with other commands can be inputted on a screen outputted by the screen output unit, it is possible for the user to easily specify and execute a desired process by combining a synchronously executable command and an asynchronously executable command.

Further, in the information processing apparatus of the present invention, the command execution unit executes a command specified to be synchronously executed by the synchronization specifying information received by the specifying information receiving unit after an execution end of a command specified to be synchronously executed by immediately previous synchronization specifying information.

With this configuration, it is possible to execute a command required to be synchronized by synchronizing the command with an immediately previous synchronous command regardless of whether execution of an asynchronous command is ended or not.

Effect of the Invention

In accordance with an information processing apparatus of the present invention, it is possible for a user to easily execute a desired process by combining a synchronously executable command and an asynchronously executable command.

BEST MODE FOR CARRYING OUT THE INVENTION

Hereinafter, embodiments of an information processing apparatus will be described with reference to the accompanying drawings. In the embodiments, elements assigned same reference numerals are operated in the same way, and, thus, redundant description thereof may be omitted.

(Embodiment)

FIG. 1 is a block diagram of an information processing apparatus in accordance with the present embodiment.

Further, FIG. 2 is a concept view of a manufacturing apparatus management system including the information processing apparatus of the present embodiment.

An information processing apparatus 10 is directly or indirectly connected with a manufacturing apparatus 200 via a communication line or the like so as to receive and transmit information. The information processing apparatus 10 controls operations of, for example, a multiple number of manufacturing apparatuses 200. The information processing apparatus 10 and the multiple manufacturing apparatuses 200 may be connected with each other via, for example, Internet and a network such as a wireless or wired LAN or may be connected via a short-range wireless communication system such as Bluetooth (registered trademark). Otherwise, the information processing apparatus 10 and the multiple number of manufacturing apparatuses 200 may be directly connected with each other by a signal line. Further, the information processing apparatus 10 may be included in one of the multiple manufacturing apparatuses 200 or may be regarded as a part of the manufacturing apparatus 200. Herein, there will be explained an example using a single manufacturing apparatus 200, but the information processing apparatus 10 may be connected with the multiple number of manufacturing apparatuses 200. The multiple number of manufacturing apparatuses 200 may be different from each other, may be identical with each other, or may include the same manufacturing apparatus.

The information processing apparatus 10 includes a command storage unit 101, a screen configuration unit 102, a screen output unit 103, a specifying information receiving unit 104, a synchronization specifying information storage unit 105, and a command execution unit 106.

The command storage unit 101 may store one or more commands of which a process sequence is specified. The command is e.g., an instruction for the information processing apparatus 10 to execute a desired process. Further, the command may be a program or an executable file for executing a predetermined process. Furthermore, the command may include target information specifying an apparatus as a target to be controlled by a command, an apparatus as a target by which a command is executed. Moreover, the target information may be managed in pairs with each corresponding command. In this case, even if the commands are identical with each other, if the commands are corresponding to other target information, the commands may be regarded as different from each other. The command of which a process sequence is specified means, to be specific, a command of which a sequence of execution start is specified. How to specify and how to manage a process sequence of the command is not restricted. By way of example, it may be possible to manage the process sequence using a management table in which a process sequence is defined or may be possible to assign information indicating a process sequence to the command. Each command stored in the command storage unit 101 can be executed in synchronization with or in asynchronization with other commands. A timing for storing the command in the command storage unit 101 is not restricted. By way of example, the command may be stored at the time of factory shipment or may be appropriately stored by a user. The command storage unit 101 is not only appropriately implemented by using a non-volatile storage medium but can also be implemented by using a volatile storage medium.

The screen configuration unit 102 configures a screen for receiving synchronization specifying information which specifies whether to execute each command stored in the command storage unit 101 in synchronization with or in asynchronization with other commands. Here, for the sake of explanation, a command to be synchronously executed, i.e., a synchronously executable command will be referred to as a synchronous command and a command to be asynchronously executed will be referred to as an asynchronous command. To synchronously execute means that execution is not performed until another predetermined command, such as a command immediately previously executed, is ended. Further, to asynchronously execute means that execution is performed without waiting for an execution end of another predetermined command, such as a command immediately previously started. The synchronous command is a command to be executed in synchronization with, for example, a command immediately previously executed. Furthermore, the synchronous command may be regarded as, for example, a command to be executed not simultaneously with but exclusively from other commands. To be specific, the synchronous command is a command to be executed after an execution end of an immediately previously started command. Here, the immediately previously started command may be any one of a synchronous command of which execution has been started one time earlier and an asynchronous command. Otherwise, the immediately previously started command may be limited to only one of a synchronous command immediately previously started, i.e., one time earlier and an asynchronous command immediately previously started, i.e., one time earlier. The same applies to the asynchronous command. Here, there will be explained an example in which the synchronous command is a command to be executed in synchronization with a synchronous command immediately previously executed, i.e., a command to be executed after an execution end of an immediately previously started synchronous command. The asynchronous command is a command to be executed in asynchronization with a command immediately previously executed. To be specific, the asynchronous command is a command to be executed without waiting for an execution end of an immediately previously started command. The asynchronous command is a command to be executed in parallel with, for example, a process executed by another command. By way of example, the asynchronous command may be executed at a random timing, a predetermined timing or a trigger between an execution start of an immediately previously started command and an execution end thereof. Further, by way of example, the asynchronous command may be executed right after an execution of the immediately previously started command. The synchronization specifying information is, to be specific, information specifying a command stored in the command storage unit 101 as either one of the synchronous command or the asynchronous command. As a result, the synchronization specifying information may be information capable of specifying whether each command is executed in synchronization with or in asynchronization with another command, such as, an immediately previously started command. By way of example, the synchronization specifying information may be information selecting whether each command is a synchronous command or an asynchronous command. Further, the synchronization specifying information may be information selecting whether or not each command is a synchronous command, or selecting whether or not each command is an asynchronous command. The screen for receiving synchronization specifying information is a screen used as, for example, an input interface of the synchronization specifying information. Here, the screen may be data such as bitmap data for displaying a screen. To be specific, the screen configuration unit 102 displays information showing each command stored in the command storage unit 101, e.g., identification information such as a command name, a command number, a command process sequence or a part of a command string. Further, the screen configuration unit 102 configures a screen for displaying an input object such as a field, a button or a check box for receiving an input of synchronization specifying information of each command. By way of example, the screen configuration unit 102 reads screen configuration information from a non-illustrated storage unit storing the screen configuration information used for showing a screen for receiving synchronization specifying information, and configures a screen by using information managing commands stored in the command storage unit 101 and the read screen configuration information. The screen configuration information may be, for example, HTML, information of a ruled line, setting information for configuring a screen, or a screen configuration program. The screen configuration information may be template information. Further, the screen configuration unit 102 does not necessarily configure a screen for receiving synchronization specifying information with respect to all commands stored in the command storage unit 101 and may configure a screen for receiving synchronization specifying information with respect to some of the commands. Typically, the screen configuration unit 102 can be implemented by using a MPU and a memory. A process sequence of the screen configuration unit 102 may be typically implemented by software, which is stored in a storage medium such as a ROM. Further, it may also be implemented by hardware (a dedicated circuit).

The screen output unit 103 outputs a screen configured by the screen configuration unit 102. The screen configured by the screen configuration unit 102 and outputted by the screen output unit 103 may be a screen of an input interface for receiving the above-described synchronization specifying information. Here, the term "output" includes displaying on a display device, printing on a paper by a printer, and a transmission to an external device. The screen output unit 103 may or may not include an output device such as a display and a printer. The screen output unit 103 can be implemented by driver software of an output device, or driver software of an output device and the output device.

The specifying information receiving unit 104 receives synchronization specifying information inputted to a screen outputted by the screen output unit 103. By way of example, the specifying information receiving unit 104 receives synchronization specifying information on each command stored in the command storage unit 101 through a screen of an input interface for receiving the above-described synchronization specifying information outputted by the screen output unit 103. To be specific, the specifying information receiving unit 104 receives synchronization specifying information corresponding to an input performed onto a screen by manipulating a mouse, a keyboard or the like. The reception of the synchronization specifying information may be, for example, a reception from an input means, a reception of an input signal transmitted from another device or reading of information from a storage medium. The input means of the synchronization specifying information may be a numeric keypad, a keyboard, a mouse, or a menu screen. The specifying information receiving unit 104 can be implemented by a device driver of the input means such as a numeric keypad or a keyboard, or control software of a menu screen. Further, each of the synchronization specifying information received by the specifying information receiving unit 104 may be stored in the synchronization specifying information storage unit 105 to be described later or a storage medium (not illustrated) such as a memory, a hard disk in pairs with each command.

The synchronization specifying information storage unit 105 stores synchronization specifying information received by the specifying information receiving unit 104, in pairs with each command. By way of example, synchronization specifying information and a command corresponding to the synchronization specifying information are stored as two attribute values of a single record. Here, the term "storage" may include a temporary memory. The synchronization specifying information storage unit 105 may be implemented by using a non-volatile storage medium but can also be implemented by using a volatile storage medium.

The command execution unit 106 executes commands stored in the command storage unit 101 according to a process sequence so as to execute a command (i.e., a synchronous command) specified to be synchronously executed after an execution end of an immediately previous command and execute a command (i.e., an asynchronous command) specified to be asynchronously executed without waiting for an execution end of an immediately previous command, with reference to the synchronization specifying information received by the specifying information receiving unit 104. The synchronization specifying information may be appropriately read from, for example, the synchronization specifying information storage unit 105. The command execution unit 106 executes each command stored in, for example, the command storage unit 101 according to a predetermined process sequence. Further, the synchronous command may be executed at the time of an execution end of an immediately previous command. Furthermore, the asynchronous command may be executed without waiting for an execution end of an immediately previous command. To be specific, the command execution unit 106 may execute the asynchronous command after, for example, right after, an execution end of the immediately previous command. In addition, the asynchronous command may be executed before an execution end of the immediately previous command. A trigger or timing of an execution end of the asynchronous command is not limited. For example, the command execution unit 106 determines whether a command to be executed according to a specified process sequence is a synchronous command or an asynchronous command with reference to synchronization specifying information and, then, determines a timing of starting execution of the command and, then, executes each command. Further, the command execution unit 106 may record one or more commands, of which a process sequence is specified, stored in the command storage unit 101 together with information specifying a timing of starting execution with reference to synchronization specifying information, and then, may execute the recorded commands. A process of executing or ending a synchronous command or an asynchronous command has been well known to the public, and, thus, explanation thereof will be omitted. The command execution unit 106 can be typically implemented by using a MPU and a memory. A process sequence of the command execution unit 106 is typically implemented by using software, which is stored in a storage medium such as a ROM. However, it may also be implemented by using hardware (a dedicated circuit).

Further, control information depending on a result of execution by the command execution unit 106 may be outputted or transmitted from, e.g., the information processing apparatus 10 to the manufacturing apparatus 200, or information indicating a process status depending on a result of execution by the command execution unit 106 may be displayed on a monitor or the like. Furthermore, an output unit for performing an output operation such as a transmission or a display has been well known to the public, and, thus, explanation thereof will be omitted herein.

The manufacturing apparatus 200 performs a predetermined semiconductor manufacturing process onto a target substrate such as a glass substrate for an organic film, a semiconductor wafer, or a liquid crystal panel substrate. The manufacturing apparatus 200 may perform various processes such as a film forming process, an etching process, and a thermal oxidation process onto the target substrate. The manufacturing apparatus 200 may be, for example, a film forming apparatus for an organic EL display, a manufacturing apparatus such as a semiconductor wafer manufacturing apparatus, a liquid crystal panel manufacturing apparatus, or a panel manufacturing apparatus for a plasma display. Within the manufacturing apparatus 200, there may be installed one or more devices (not illustrated) used for controlling an operation of the manufacturing apparatus 200 such as a control of multiple temperatures, a control of a valve. The above-described information processing apparatus 10 may execute commands for these devices.

FIG. 3 shows an example of the manufacturing apparatus 200. Here, a RLSA (Radial Line Slot Antenna) plasma CVD apparatus has been explained as the manufacturing apparatus 200, but the manufacturing apparatus 200 may be other kinds of manufacturing apparatuses.

The RLSA plasma CVD apparatus includes a cylindrical processing chamber 300 having an open ceiling surface. A shower plate 305 is inserted into an opening of the ceiling surface. The processing chamber 300 and the shower plate 305 are sealed by O-rings 310 each installed between a step-shaped portion of an inner wall of the processing chamber 300 and an outer peripheral portion of a bottom surface of the shower plate 305, whereby there is formed a processing space U for performing a plasma process. By way of example, the processing chamber 300 is made of metal such as aluminum and the shower plate 305 is made of metal such as aluminum or a dielectric material, and they are electrically grounded.

Provided on a bottom portion of the processing chamber 300 is a susceptor (a mounting table) 315 for mounting a wafer W thereon via an insulator 320. The susceptor 315 is connected with a high frequency power supply 325*b* via a matching unit 325*a* and a predetermined bias voltage is applied to the inside of the processing chamber 300 by a high frequency power outputted from the high frequency power supply 325*b*. Further, the susceptor 315 is connected with a high voltage DC power supply 330*b* via a coil 330*a* and configured to electrostatically attract a substrate G by a DC voltage outputted from the high voltage DC power supply 330*b*. Furthermore, a heater 331 is embedded in the susceptor 315 and configured to heat the wafer W by power supplied from a heater power supply 332. Moreover, installed within the susceptor 315 is a cooling jacket 335 that supplies cooling water for cooling the wafer W.

An upper part of the shower plate 305 is covered with a cover plate 340. Provided on a top surface of the cover plate 340 is a radial line slot antenna 345. The radial line slot antenna 345 includes a disc-shaped slot plate 345*a* in which a multiple number of slots (not illustrated) are formed, a disc-shaped antenna main body 345*b* that holds the slot plate 345*a*, and a wavelength shortening plate 345*c* made of a dielectric material such as alumina ($Al_2O_3$) and positioned between the slot plate 345*a* and the antenna main body 345*b*. Various radial line slot antennas 345 can be prepared such as small size, large size, a slot pattern A and a slot pattern B, and, thus, it may be replaced appropriately for the purpose of use. The radial line slot antenna 345 is connected with an external microwave generator 355 via a coaxial waveguide 350.

The processing chamber 300 is equipped with a vacuum pump (not shown) and a gas in the processing chamber 300 is discharged via a gas discharge line 360, and, thus, the processing space U can be depressurized to a desired vacuum level.

A gas supply source 365 includes a multiple number of valves V, a multiple number of mass flow controllers MFC, and a multiple number of material gas supply sources 365*a* that supply one or more kinds of first material gases and one or more kinds of second material gases. The gas supply source 365 controls opening and closing of each of the valves V and an opening degree of each of the mass flow controllers MFC so as to supply a gas of a desired concentration into the processing chamber 300. In this way, the first material gas passes through a first gas flow path 370*a* and is supplied to an upper portion of the processing space U from a gas inlet line 375 penetrating the shower plate 305, and the second material gas passes through a second gas flow path 370*b* and is supplied to a lower portion than the first material gas from an integrated gas pipe 380. With this configuration, various kinds of gases can be converted into plasma by a microwave introduced into the processing space U from the microwave generator 355 via the slots and the shower plate 305, and a film is formed on the substrate by the generated plasma.

The manufacturing apparatus 200 may further include one or more non-illustrated controllers. Each of the controllers has control targets, for example, control target objects or control target items such as a pressure and a temperature, at least some of which may be or may not be the same. The controller controls various operations of the manufacturing apparatus 200 based on parameter values of a recipe which set a processing condition on a preset target object to be processed or preset static parameter values of the manufacturing apparatus 200 which typically cannot be changed by the user. By way of example, if a processing temperature is preset, the controller performs a so-called feedback control of an output of the heater based on a temperature detected by one or more non-illustrated temperature detectors so as to control a temperature in the processing chamber 300 to be the preset temperature based on a preset value. Further, the controller controls a pressure in the processing chamber 300 to be a preset pressure based on a preset value. By way of example, a pre-stored reference value may be a target value of a control. Furthermore, the controller performs a control of the entire manufacturing apparatus 200, for example, a control of a gas flow rate and a control of opening and closing of a valve, but these controls have been well known to the public, and, thus, explanation thereof will be omitted. The above-described parameter values are stored in a non-illustrated storage medium such as a memory and read by the controller if necessary. This storing operation includes a temporary storing operation. A method of receiving the parameter values and a method of storing the parameter values in the storage medium are not limited. By way of example, parameter values may be inputted by the user by a non-illustrated receiving unit of the manufacturing apparatus 200 and stored in the storage medium. Parameter values outputted from other devices such as the information processing apparatus 10 may be received by the non-illustrated receiving unit of the manufacturing apparatus 200 and stored in the storage medium. Further, instead of being stored, the parameter values may be directly received by the controller, and the controller may control and specify an operation. Further, the controller may allow a non-illustrated output unit to output information detected by the non-illustrated temperature detector to the information processing apparatus 10. The controller can be implemented by using a MPU and a memory. A process sequence of the controller is typically implemented by software, which is stored in a storage medium such as a ROM. However, it may also be implemented by hardware (a dedicated circuit).

Hereinafter, an operation of an information processing apparatus will be explained with reference to a flow chart of FIG. 4. Here, for the simplicity of explanation, there will be explained a case where if a command is an asynchronous command, the asynchronous command is immediately executed by the command execution unit 106. Further, there will be explained a case where if a command is a synchronous command, the synchronous command is executed after an execution end of an immediately previous synchronous command.

(Step S401) A screen configuration unit 102 determines whether or not to configure a screen which receives synchronization specifying information. Further, how to determine whether or not to configure a screen by the screen configuration unit 102 is not limited. By way of example, if an instruction to configure a screen is received from a user via a non-illustrated receiving unit, it may be determined to configure a screen which receives synchronization specifying information. If it is determined to configure the screen, a process proceeds to step S402 and if not, the process proceeds to step S406.

(Step S402) The screen configuration unit 102 configures a screen which receives synchronization specifying information. By way of example, the screen configuration unit 102 acquires information such as a process sequence of a command stored in a command storage unit 101 or identification information of the command and configures a screen which receives synchronization specifying information by using the acquired information and screen configuration information read from a non-illustrated storage unit.

(Step S403) A screen output unit 103 outputs, for example, displays, the screen configured in step S402.

(Step S404) A specifying information receiving unit 104 receives synchronization specifying information inputted to the screen, outputted in step S402, for receiving the synchronization specifying information. To be specific, the specifying information receiving unit 104 receives synchronization specifying information of each command stored in the command storage unit 101.

(Step S405) The specifying information receiving unit 104 stores the synchronization specifying information received in step S404 in a non-illustrated storage medium such as a memory. Then, the process returns to step S401.

(Step S406) A command execution unit 106 determines whether or not to execute one or more commands stored in the command storage unit 101. How to determine whether or not to execute a command by the command execution unit 106 is not limited. By way of example, if an instruction to execute a command is received from a user, it may be determined to execute a command. Further, if an instruction to execute a command is received from other devices, it may be determined to execute a command. If it is determined to execute the command, the process proceeds to step S407 and if not, the process returns to step S401.

(Step S407) The command execution unit 106 determines whether or not the specifying information receiving unit 104 received synchronization specifying information. By way of example, the specifying information receiving unit 104 determines whether or not synchronization specifying information is stored in a storage medium which stores synchronization specifying information. If so, the process proceeds to step S408 and if not, the process returns to step S402. Further, instead of returning to step S402, the process may return to step S401 with an error display which means that the synchronization specifying information has not been specified.

(Step S408) The command execution unit 106 substitutes 1 for a counter k.

(Step S409) The command execution unit 106 reads a command to be executed in a $k^{th}$ order (hereinafter, referred to as "$k^{th}$ command") from the command storage unit 101.

(Step S410) The command execution unit 106 starts to execute the $k^{th}$ command.

(Step S411) The command execution unit 106 reads the synchronization specifying information corresponding to the $k^{th}$ command received in step S404 and determines whether or not the $k^{th}$ command is a synchronous command. If so, the process proceeds to step S412 and if not, i.e., if the $k^{th}$ command is an asynchronous command, the process proceeds to step S413.

(Step S412) The command execution unit 106 waits for an execution end of a synchronous command executed one time earlier, i.e., a synchronous command immediately previously executed. If the execution is ended, the process proceeds to step S413. How to determine whether or not the execution of the immediately previous synchronous command is ended by the command execution unit 106 is not limited. By way of example, in case that the synchronous command is a command for controlling other devices such as a manufacturing apparatus 200, if information indicating that an operation of the manufacturing apparatus 200 in response to the command is ended is received, it may be determined that the operation has been ended.

(Step S413) The command execution unit 106 increments the counter k by 1.

(Step S414) The command execution unit 106 determines whether or not there exists the $k^{th}$ command in the command storage unit 101. If there exists the $k^{th}$ command in the command storage unit 101, the process returns to step S409 and if not, the process proceeds to step S415.

(Step S415) The command execution unit 106 determines whether or not execution of all commands has been ended. If execution of all commands has been ended, the process proceeds to step S401 and if not, the process returns to step S415.

Further, in the flow chart of FIG. 4, the process is ended by an interrupt such as power-off or an end of the process.

Hereinafter, there will be explained a detailed operation of an information processing apparatus in accordance with the present embodiment. Here, there will be explained a case where the manufacturing apparatus 200 includes devices having non-illustrated identification information such as "DRP1", "VB1-P1", "VB2-P1", "VB3-P1", "TMP1", and "TMP2" to control opening and closing of a valve or to control a temperature, and the information processing apparatus 10 executes a command for these devices.

FIG. 5 shows a command management table for managing commands stored in the command storage unit 101. Here, there will be explained a case where a multiple number of commands stored in a command management table constitutes a so-called macro which is a set of commands used for executing a series of processes. The command management table has fields of "ID", "macro name", "sequence", "device name", and "command." Here, "ID" is identification information for managing a record of a command.

"Macro name" is information for identifying a macro in which each command is included. "Sequence" is a process sequence of a command. "Command" is a name of a command for specifying a command. A name of each command has a one-to-one correspondence to each command. Further, "command" may be regarded as a command itself. This command management table is stored in, for example, a non-illustrated storage medium such as a memory.

FIG. 6 is a drawing for showing an example of screen configuration information used to configure a screen which receives synchronization specifying information. Screen configuration information is stored in a non-illustrated storage unit or the like. The screen configuration information may be a style file, i.e., a template, for defining a layout of a screen which receives synchronization specifying information of each command stored in the command storage unit 101. In this screen configuration information, "[ ]" indicates a variable and a string described within "[ ]" corresponds to a field name shown in FIG. 5. By way of example, corresponds to the field "command" in FIG. 5. Further, a check box 61 is an object for marking which receives synchronization specifying information indicating that a command is a synchronous one, and a check box 62 is an object for marking which receives synchronization specifying information indicating that a command is an asynchronous one. A region surrounded by dotted line with a mark "#1" indicates that information in this region surrounded by dotted line is displayed repeatedly as many times as the number of the records in the command management table shown in FIG. 5. Such a style file can be configured by, for example, HTML.

Assuming that a user gives the information processing apparatus 10 an instruction to display a screen for inputting synchronization specifying information of a command constituting a macro of which "macro name" is "first process" on a monitor (not illustrated) by using a menu of the information processing apparatus 10 by manipulating a mouse, a keyboard or the like.

A screen configuration unit 102 reads screen configuration information, as shown in FIG. 6, stored in a non-illustrated storage unit and configures a screen for receiving synchronization specifying information by using the screen configuration information and information of the command managed by the command management table shown in FIG. 5. To be specific, the screen configuration unit 102 configures a screen for receiving synchronization specifying information by arranging the fields read from the command management table of FIG. 5 in order of records in a style file of the screen configuration information, as shown in FIG. 6, read from the non-illustrated storage unit. Then, the screen configured by the screen configuration unit 102 is displayed on the monitor by a screen output unit 103. A display example is shown in FIG. 7. Further, as for a command which is not necessary to receive a specifying information of whether or not to be synchronized or asynchronized, such as a command determined to be executed in asynchronization, a field for indicating that it is not necessary to receive a specifying information of whether or not to be synchronized or asynchronized may be added to the command management table shown in FIG. 5 in advance. Thus, if information indicating that it is not necessary to receive a specifying information of whether or not to be synchronized or asynchronized has been inputted to this field, a screen for receiving synchronization specifying information of that command may not be displayed. For example, the check box 61 for that command may not be displayed.

Subsequently, if the user manipulates the mouse, i.e., moves a pointer over the check box 61 or check box 62 corresponding to each command on the screen for receiving synchronization specifying information as shown in FIG. 7 and clicks a mouse button, a specifying information receiving unit 104 receives synchronization specifying information corresponding to the clicked check box. By way of example, if the check box 61 is clicked, the specifying information receiving unit 104 receives synchronization specifying information which specifies a command in the same line as the clicked check box 61 as a synchronous command. Further, if the check box 62 is clicked, the specifying information receiving unit 104 receives synchronization specifying information which specifies a command in the same line as the clicked check box 62 as an asynchronous command. The clicked check box is marked with a check mark. FIG. 8 shows a display example of a case where an input of synchronization specifying information is received. By way of example, in FIG. 8, as for a command having a process order of "2", i.e., a command named "open" corresponding to a device named "VB1-P1" as a control target, there is received synchronization specifying information specifying that the command is a synchronous command. Further, as for a command having a process order of "3", i.e., a command named "open" corresponding to a device named "VB2-P1" as a control target, there is received synchronization specifying information specifying that the command is a synchronous command.

Thereafter, the user manipulates the mouse, i.e., clicks a button "decide" 70 on the screen for receiving synchronization specifying information as shown in FIG. 7, or manipulates a menu for the same function, and, thus, the reception of the synchronization specifying information is ended. The specifying information receiving unit 104 stores the received synchronization specifying information in the synchronization specifying information storage unit 105.

FIG. 9 shows a synchronization specifying information management table for managing the synchronization specifying information received by the specifying information receiving unit 104 and stored in the synchronization specifying information unit 105. A synchronization specifying information management table includes fields of "ID", "synchronization", and "asynchronization." "ID" is identification information for identifying a command and corresponds to "ID" of FIG. 5. "Synchronization" is information indicating that a command corresponding to "ID" of the same record is a synchronous one, and by way of example, in case of a value of "1", it indicates that the command of the record having the same "ID" in the command management table of FIG. 5 is a synchronous one. "Asynchronization" is information indicating that a command corresponding to "ID" of the same record is an asynchronous one, and by way of example, in case of a value of "1", it indicates that the command of the record having the same "ID" in the command management table of FIG. 5 is an asynchronous one. Further, both fields having a value of "−" indicates that synchronization specifying information has not been specified. As for the command marked with a check mark in the check box 61 corresponding to "synchronization" of FIG. 8, "1" is stored as a value of the field "synchronization" in the record of the synchronization specifying information management table of FIG. 9 which has the same "ID" as "ID" of the command shown in the command management table of FIG. 5. Further, as for the command marked with a check mark in the check box 62 corresponding to "asynchronization" of FIG. 8, "1" is stored as a value of the field "asynchronization" in record of the synchronization specifying information management table of FIG. 9 which has the same "ID" as "ID" of the command shown in the command management table of FIG. 5. Further, "−" indicates that values of the fields "synchronization" and "asynchronization" have not been stored. The synchronization specifying information management table may be managed while being stored in, for example, a non-illustrated storage unit such as a memory or the command storage unit 101. Furthermore, herein, a record of the command management table corresponds to a record of the synchronization specifying information management table by using the field named "ID", but the command management table and the synchronization specifying information management table may be rearranged and managed in a single management table.

Then, assuming that the user gives the information processing apparatus 10 an instruction to display a result of specifying synchronization specifying information by manipulating a menu. The screen output unit 103 displays a list of commands, of which synchronization specifying information has been specified by using information of the command management table shown in FIG. 5 and the synchronization specifying information management table shown in FIG. 9, on a monitor. FIG. 10 shows a display example. In FIG. 10, "step information" is a field combining a value of "sequence" of FIG. 5 and information indicating that it is a command, i.e., a string of "operation" in this case. By way of example, "2. Operation" indicates that it is a command to be processed in a "second" order. "Device" and "command" correspond to "device" and "command" of FIG. 5, respectively. "Other details" is a field indicating whether a command is a synchronous one or not. In FIG. 9, if a value of the field "synchronization" is "1", a command is a synchronous one, and, thus, a value of the field "other details" is marked as "waiting." "Timeout" is a field indicating whether or not to determine an end of a command as a timeout. In FIG. 9, if a value of the field "asynchronization" is "1", a command is an asynchronous one, and, thus, a value of "timeout" is marked as "no waiting for an end."

Subsequently, assuming that the user gives the information processing apparatus 10 an instruction to execute a command stored in the command storage unit 101.

First, the command execution unit 106 reads a command recorded as "1" in the "sequence" of the command management table shown in FIG. 5 from the command storage unit 101. Then, the command execution unit 106 executes the read command. Here, by way of example, the command execution unit 106 reads a command named "start" shown in FIG. 5 and executes the read command with respect to a device named "DRP1."

Then, the command execution unit 106 reads a command in the next order to the command in the immediately previous order among the commands managed by the command management table of FIG. 5 from the command storage unit 101. Thereafter, the command execution unit 106 determines whether the read command is a synchronous one or an asynchronous one with reference to the synchronization specifying information management table of FIG. 8. Here, by way of example, the command execution unit 106 reads a command named "open" in a second process order corresponding to "VB1-P1" from the command management table. Further, the command execution unit 106 reads "002" which is an "ID" corresponding to this command from the command management table. Then, the command execution unit 106 checks which field "synchronization" or "asynchronization" has "1" in a record having an "ID" of "002" in the synchronization specifying information management table of FIG. 9. In this case, "synchronization" has "1", and, thus, the command execution unit 106 determines that the command named "open" to be subsequently executed with respect to the "VB1-P1" is a synchronous one.

For this reason, the command execution unit 106 determines whether or not execution of the immediately previously executed command named "start" for the device named "DRP1" is ended. If the execution is ended, the command named "open" for "VB1-P1" is executed. But if the execution is not ended, an execution of the command named "open" for "VB1-P1" is on standby until the execution is ended.

Assuming that the execution of the command named "start" for "DRP1" is ended and the command execution unit 106 executes the synchronous command named "open" for "VB1-P1."

The command execution unit 106 reads a command named "open" corresponding to "VB2-P1", which is next order to the immediately previous command of the "second" order among the commands managed by the command management table of FIG. 5 from the command storage unit 101. Further, the command execution unit 106 reads "003" which is an "ID" corresponding to this command from the command management table.

Then, in the same manner as stated above, the command execution unit 106 determines whether the command named "open" for "VB2-P1" is a synchronous one or an asynchronous one by using the read "ID" and the synchronization specifying information management table. In this case, since a value of the field "synchronization" is "1" in the record having an "ID" of "003" in the synchronization specifying information management table, it is determined to be a synchronous command.

For this reason, the command execution unit 106 waits for an execution end of the immediately previously executed command named "open" for the device named "VB1-P1" and then executes the command named "open" for "VB2-P1."

The command execution unit 106 reads a command named "start" corresponding to a device named "TMP1" in the next order to the immediately previous command of a "third" order among the commands managed by the command management table of FIG. 5 from the command storage unit 101. Further, the command execution unit 106 reads "004" which is an "ID" corresponding to this command from the command management table.

Thereafter, the command execution unit 106 checks whether the command named "start" for the device named "TMP1" is a synchronous one or an asynchronous one with reference to the read "ID" and the synchronization specifying information management table. In this case, since a value of the field "asynchronization" is "1" in the record having an "ID" of "004" in the synchronization specifying information management table, it is determined to be an asynchronous command.

For this reason, the command execution unit 106 does not wait for an execution end of the immediately previously executed command named "open" for the device named "VB2-P1" and executes the command named "start" for the device named "TMP1."

Further, in the same manner, as for a command named "start" for a device named "TMP2" in a "fifth" order, a value of the field "asynchronization" corresponding to this command is "1", and, thus, it is determined to be an asynchronous command. Therefore, the command execution unit 106 does not wait for an execution end of the immediately previously executed command named "start" for the device named "TMP1" and executes the command named "start" for the device named "TMP2."

Subsequently, in the same manner as for the command named "open" for the device named "VB2-P1", the command execution unit 106 determines that since a value of the field "synchronization" corresponding to a command named "open" in a "sixth" order is "1" with respect to a device named "VB3-P1", the command is a synchronous one. Further, the command execution unit 106 determines whether or not execution of the immediately previously executed synchronous command named "open" is ended with respect to the device named "VB2-P1", and if the execution is ended, the command named "open" to "VB3-P1" is executed. But if the execution is not ended, the command named "open" for the device "VB3-P1" is on standby until the command named "open" for the device named "VB2-P1" is ended.

Thereafter, the commands stored in the command storage unit 101 are executed in the same manner as stated above.

Hereinafter, there will be explained a timing of executing each command stored in the command storage unit 101 with reference to FIG. 11. Here, "DRP1", "VB1-P1", "VB2-P1", "TMP1", "TMP2", and "VB3-P1" are devices 200a to 200f serving as targets of execution of commands. After an end of control by each command, each of the devices 200a to 200f sends a completion response indicating that execution of the command has been ended to the information processing apparatus 10.

By way of example, if a completion response about execution of a command named "start" is sent to the information processing apparatus 10 from the device 200a named "DRP1", a command named "open" for the device 200b named "VB1-P1" is executed. Further, if a completion response regarding execution of the command named "open" is sent to the information processing apparatus 10 from the device named "VB1-P1", a command named "open" for the device 200c named "VB2-P1" is executed. Furthermore, if a completion response regarding execution of the command named "open" is sent to the information processing apparatus 10 from the device named "VB2-P1", a command named "open" for the device 200f named "VB3-P1" is executed. Accordingly, the devices 200a to 200c and the device 200f are controlled synchronously and sequentially.

Further, right after the command named "open" for the device named "VB2-P1" is executed, a command named "start" for the device 200d named "TMP1" is executed without waiting for a completion response regarding the command named "open" from the device named "VB2-P1."

Furthermore, in the same manner, right after the command named "start" for the device named "TMP1" is executed, a command named "start" for the device 200e named "TMP2" is executed without waiting for a completion response regarding the command named "start" from the device named "TMP1."

As a result, the device 200d and the device 200e can be operated in parallel with the other devices.

In accordance with the present embodiment, it is possible to input the information specifying whether the command executed by the command execution unit 106 is to be executed in synchronization with or in asynchronization with other commands on a screen outputted by the screen output unit 103, and, thus, it is possible for the user to easily specify and execute a desired process by combining a synchronously executable command and an asynchronously executable command.

Further, in the above-described embodiment, there has been explained a case where with respect to each command on the screen outputted by the screen output unit 103, the synchronization specifying information received by the specifying information receiving unit 104 is stored in the synchronization specifying information storage unit 105, but in the present invention, synchronization specifying information in pairs with each corresponding command may be stored in advance in the synchronization specifying information storage unit 105. Further, the command execution unit 106 may determine whether or not to synchronously execute the command based on the pre-stored synchronization specifying information. Furthermore, the stored synchronization specifying information may not be the received synchronization specifying information with respect to each command through the screen outputted by the screen output unit 103. By way of example, a file storing the information including synchronization specifying information and commands in pairs as shown in FIG. 9 may be received from a non-illustrated receiving unit. The information including the synchronization specifying information and the commands in pairs may be any type of information such as text information in which pairs of synchronization specifying information and the commands are divided by a tab or a space and arranged in different lines or data of a table structure as shown in the display example of FIG. 9 or FIG. 10. Further, in such data of a table structure, each datum may be inputted to each cell as can be seen in a so-called spreadsheet which is generally used as table calculation software, or columns of the data may be divided by a space or a tab and rows of the data may be divided by a line feed code.

Further, in the above-described embodiment, as one of the commands, there is a command saying "wait until one or more asynchronously executed commands are ended." If such a command exists, the next command is executed after one or more previous asynchronous commands are ended.

Furthermore, in the above-described embodiment, each process (function) may be implemented through centralized processing by a single apparatus (system) or through distributed processing by a plurality of apparatuses.

Moreover, in each embodiment described above, there has been explained a case where the information processing apparatus is a stand-alone apparatus. However, the information processing apparatus may be a stand-alone apparatus or may be a server in a server-client system. In the latter case, the output unit or the receiving unit may receive input and output a screen via a communication line.

Further, in each embodiment described above, each unit (element) may be configured by dedicated hardware, or as for a unit (element) which can be implemented by software may be implemented by executing a program. By way of example, a program execution unit such as an MPU reads and executes software/program stored in a storage medium such as a hard disk or a semiconductor memory, whereby each unit (element) can be implemented.

Furthermore, the software implementing the information processing apparatus in each embodiment described above is a program as follows. That is, this program can allow a computer function as a command execution unit which executes one or more stored commands of which a process sequence is specified according to the process sequence so as to execute a command specified to be synchronously executed after an execution end of an immediately previous command and a command specified to be asynchronously executed without waiting for an execution end of an immediately previous command with reference to stored synchronization specifying information specifying whether the commands is executed in synchronization with or in asynchronization with other commands.

Moreover, this program can allow a computer function as a screen configuration unit which configures a screen for receiving synchronization specifying information specifying whether one or more stored commands of which a process sequence is specified is executed in synchronization with or in asynchronization with other commands; a screen output unit which outputs the screen configured in the screen configuration process; a specifying information receiving unit which receives the synchronization specifying information on each command through the screen outputted in the screen output process; and a command execution unit which executes the stored commands according to the process sequence so as to execute a command specified to be synchronously executed after an execution end of an immediately previous command and a command specified to be asynchronously executed without waiting for an execution end of an immediately previous command with reference to the synchronization specifying information received in the specifying information receiving process.

In this program, functions implemented by the program do not include a function which can be implemented by only hardware. By way of example, a function implemented by only hardware such as a modem or an interface card in an acquisition unit acquiring information or an output unit outputting information is not included.

Further, there may be one or more computers executing this program. That is, a process may be implemented by centralized processing or distributed processing.

FIG. 12 is a schematic diagram which shows an example of an external appearance of a computer implementing the information processing apparatus in accordance with the above-described embodiment by executing the program. The embodiment is implemented by computer hardware and a computer program executed on the computer hardware.

In FIG. 12, a computer system 500 includes a computer 501 having a CD-ROM (Compact Disk Read Only Memory) drive 505 and a FD (Flexible Disk) drive 506, a keyboard 502, a mouse 503, and a monitor 504.

FIG. 13 shows a computer system. In FIG. 13, the computer 501 includes in addition to the CD-ROM drive 505 and the FD drive 506, a MPU (Micro Processing Unit) 511; a ROM (Read Only Memory) 512 for storing therein, e.g., a boot-up program; a RAM (Random Access Memory) 513 connected with the MPU 511 and serving to temporarily store a command of an application program while providing a temporary storage area; and a hard disk 514 for storing therein an application program, a system program and data, and a bus 515 which connects the MPU 511, the ROM 512 with each other. Although not shown, the computer 501 may additionally include a network card allowing an access to a LAN.

A program for allowing the computer system 500 to perform the functions of the information processing apparatus in accordance with the above-described embodiments may be stored in a CD-ROM 521 or a FD 522, and the CD-ROM drive 505 or the FD drive 506 is inserted into the CD-ROM drive 505 or the FD drive 506 and may be sent to the hard disk 514. Instead, the program may be sent to the computer 501 through a non-illustrated network and stored in the hard disk 514. The program is loaded into the RAM 513 when executed. Alternatively, the program may be directly loaded from the CD-ROM 521, the FD 522, or the network.

The program may not necessarily include an operating system OS or a third party program for allowing the computer 501 to perform the functions of the information processing apparatus in accordance with the above-described embodiment. The program only needs to include commands for calling a proper function (module) and a desired result under a controlled condition. Since the way the computer system 500 is operated is well known in the pertinent art, detailed description thereof will be omitted.

The present invention is not limited to the above-described embodiments. It would be understood by those skilled in the art that various modifications may be made and the modifications are also included within the scope of the present invention.

INDUSTRIAL APPLICABILITY

As described above, an information processing apparatus in accordance with the present invention is suitable to be used in a semiconductor manufacturing process and particularly, it is useful as an information processing apparatus for executing commands including a synchronously executable command and an asynchronously executable command.

BRIEF DESCRIPTION OF THE DRAWINGS

FIG. 5 shows a command management table in accordance with the embodiment;

FIG. 6 shows an example of screen configuration information in accordance with the embodiment;

FIG. 7 shows a display example of the information processing apparatus in accordance with the embodiment;

FIG. 8 shows another display example of the information processing apparatus in accordance with the embodiment;

FIG. 9 shows an example of a synchronization specifying information management table in accordance with the embodiment;

FIG. 10 shows still another display example of the information processing apparatus in accordance with the embodiment;

Figure 1:
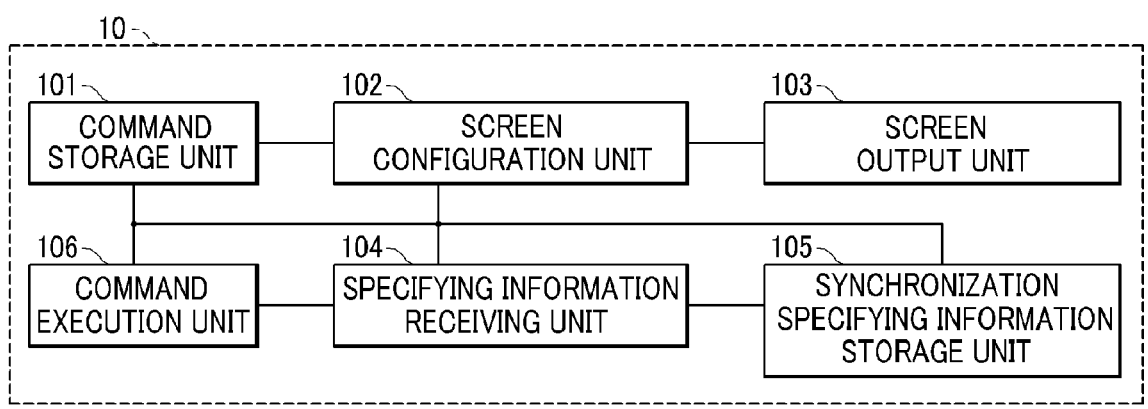
FIG. 1 is a block diagram of an information processing apparatus in accordance with an embodiment.
Figure 2:
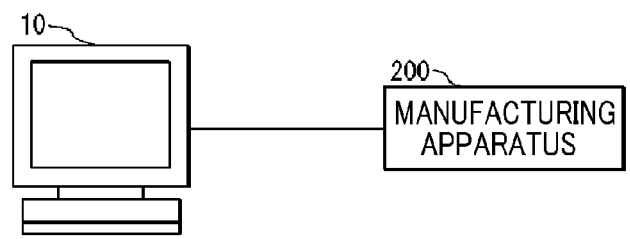
FIG. 2 is a concept view of a manufacturing apparatus management system including the information processing apparatus in accordance with the embodiment.
Figure 3:
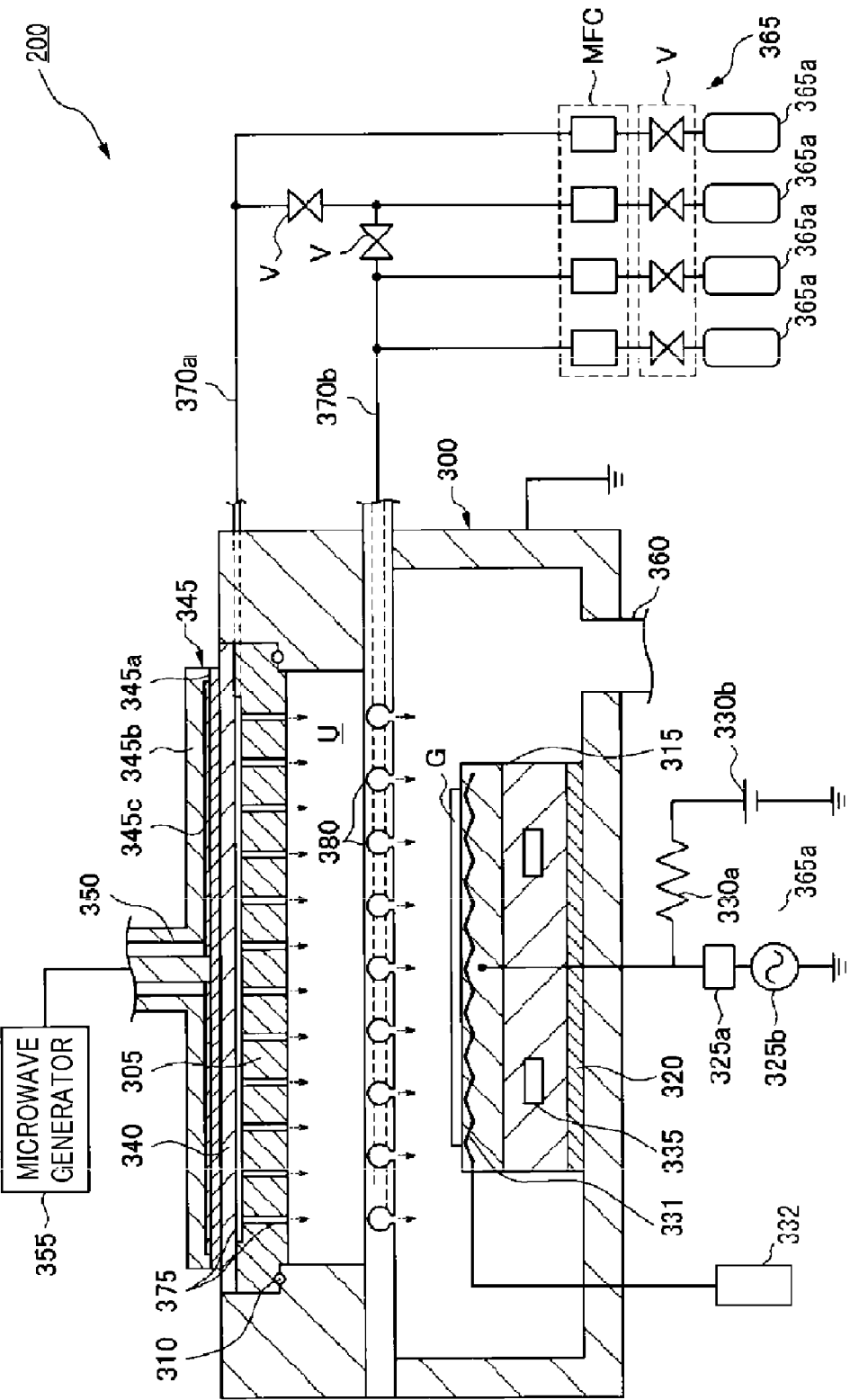
FIG. 3 shows an example of a manufacturing apparatus 200 in accordance with the embodiment.
Figure 4:
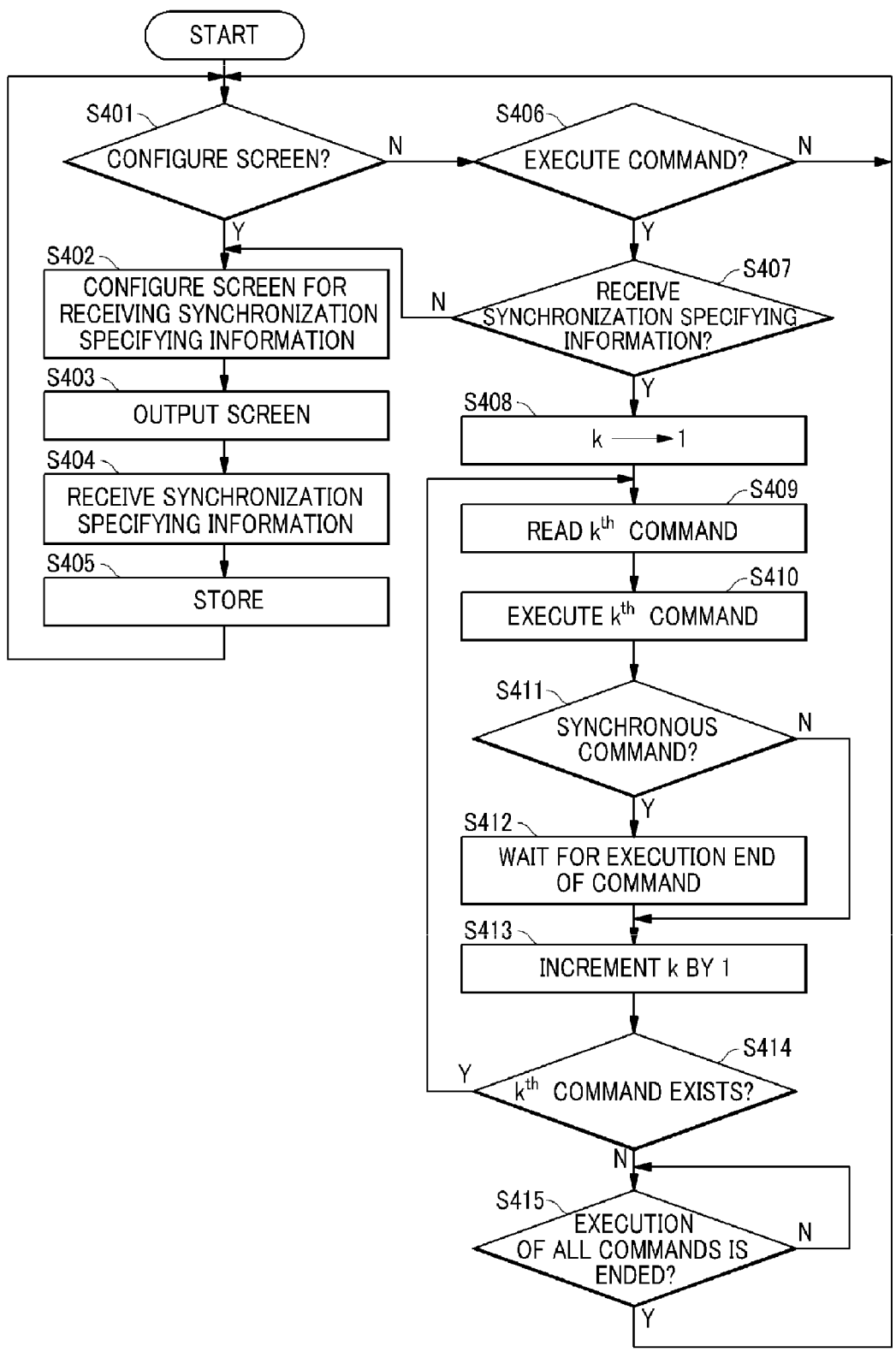
FIG. 4 is a flow chart which explains an operation of the information processing apparatus in accordance with the embodiment.
Figure 11:
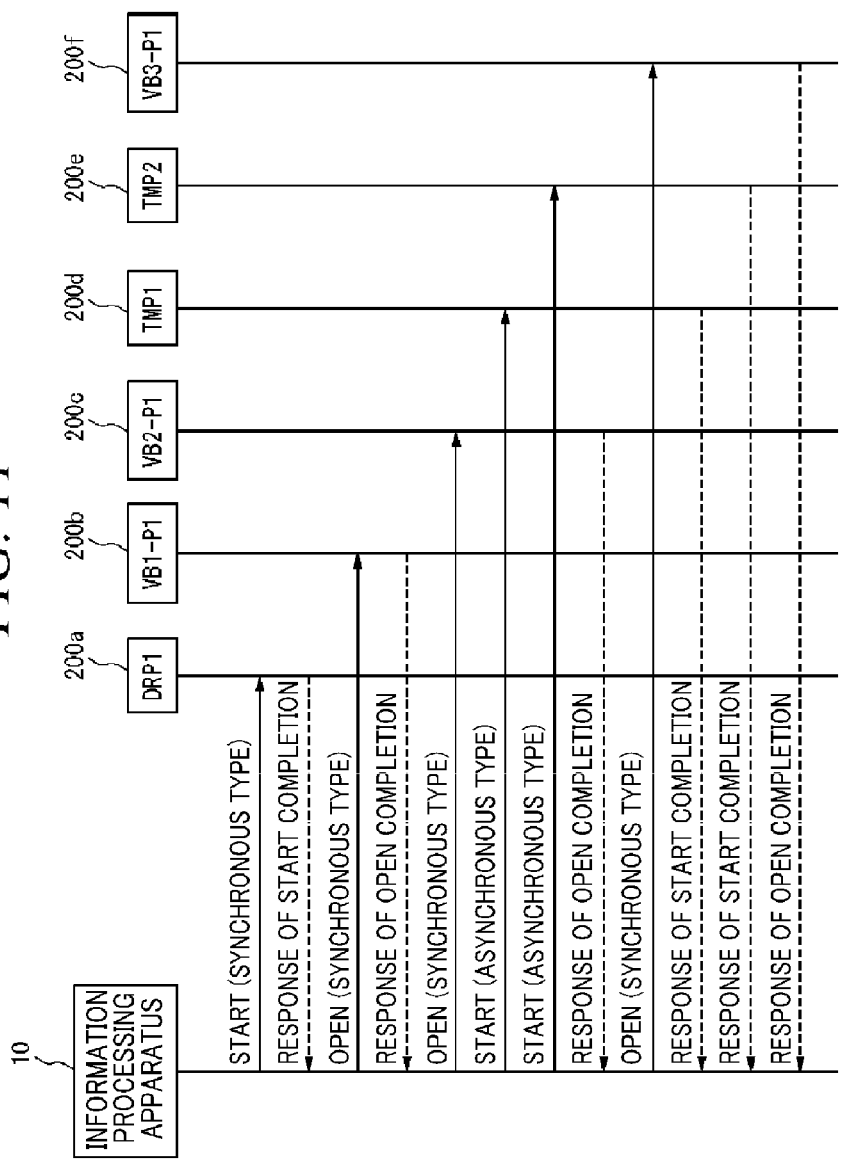
FIG. 11 is provided to explain an operation of the information processing apparatus in accordance with the embodiment.
Figure 12:
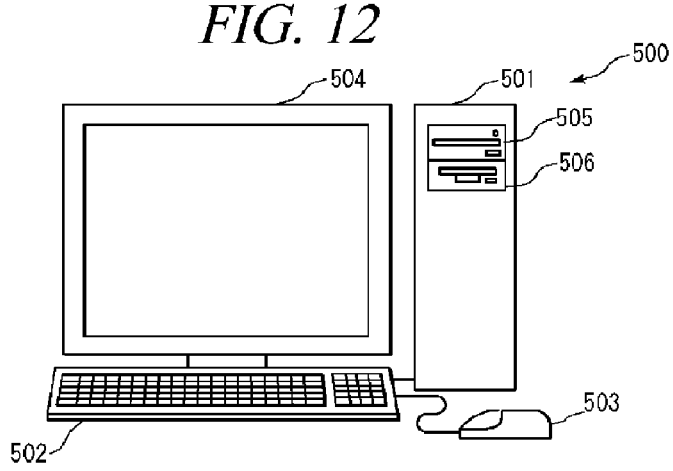
FIG. 12 is a schematic diagram which shows an example of an external appearance of a computer implementing the information processing apparatus in accordance with the embodiment.
Figure 13:
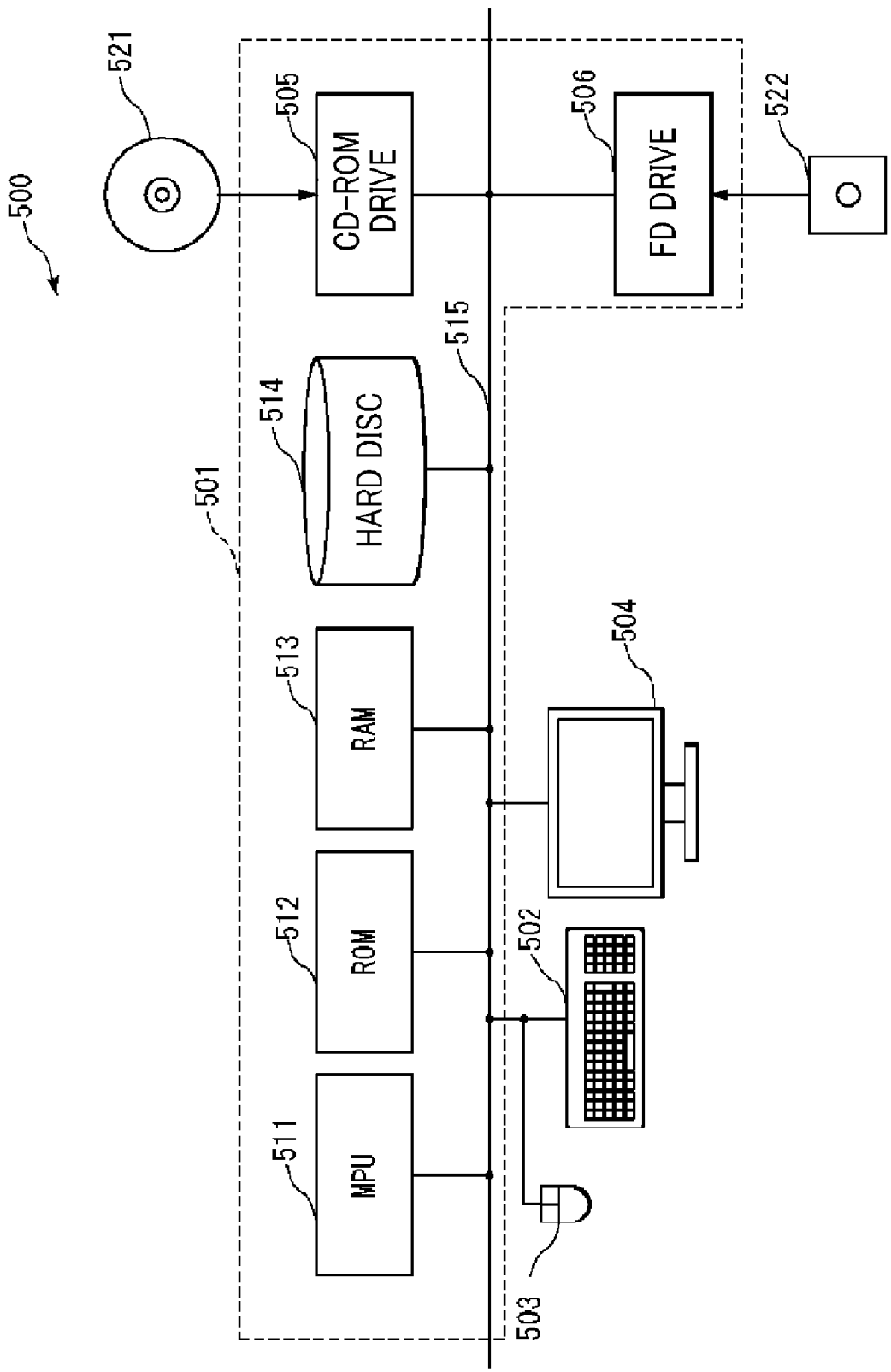
FIG. 13 shows an example of a computer system implementing the information processing apparatus in accordance with the embodiment.

What is claimed is:

1. An information processing apparatus comprising:
   a command storage unit that stores one or more commands of which a process sequence is specified;
   a synchronization specifying information storage unit that stores synchronization specifying information specifying whether each of the commands stored in the command storage unit is executed in synchronization with or in asynchronization with other commands; and
   a command execution unit which executes the commands stored in the command storage unit according to the process sequence so as to execute a command specified to be synchronously executed after an execution end of an immediately previous command and a command specified to be asynchronously executed without waiting for an execution end of an immediately previous command with reference to the synchronization specifying information stored in the synchronization specifying information storage unit.

2. An information processing apparatus comprising:
   a command storage unit that stores one or more commands of which a process sequence is specified;
   a screen configuration unit which configures a screen for receiving synchronization specifying information specifying whether each of the commands stored in the command storage unit is executed in synchronization with or in asynchronization with other commands;

a screen output unit that outputs the screen configured by the screen configuration unit;

a specifying information receiving unit that receives the synchronization specifying information on each command through the screen outputted by the screen output unit; and a command execution unit which executes the commands stored in the command storage unit according to the process sequence so as to execute a command specified to be synchronously executed after an execution end of an immediately previous command and a command specified to be asynchronously executed without waiting for an execution end of an immediately previous command with reference to the synchronization specifying information received by the specifying information receiving unit.

3. The information processing apparatus of claim 2, wherein the command execution unit executes a command specified to be synchronously executed with reference to the synchronization specifying information received by the specifying information receiving unit after an execution end of a command specified to be synchronously executed by immediately previous synchronization specifying information.

4. An information processing method performed by using a command storage unit that stores one or more commands of which a process sequence is specified, a screen configuration unit, a screen output unit, a specifying information receiving unit, and a command execution unit, the information processing method comprising:

a screen configuration process of the screen configuration unit to configure a screen for receiving synchronization specifying information specifying whether each of the commands stored in the command storage unit is executed in synchronization with or in asynchronization with other commands;

a screen output process of the screen output unit to output the screen configured in the screen configuration process;

a specifying information receiving process of the specifying information receiving unit to receive the synchronization specifying information of each command on the screen outputted in the screen output process; and a command execution process of the command execution unit to execute the commands stored in the command storage unit so as to execute a command specified to be synchronously executed after an execution end of an immediately previous command and a command specified to be asynchronously executed without waiting for an execution end of an immediately previous command with reference to the synchronization specifying information received in the specifying information receiving process.

5. A program that allows a computer function as:

a screen configuration unit which configures a screen for receiving synchronization specifying information specifying whether one or more stored commands of which a process sequence is specified is executed in synchronization with or in asynchronization with other commands;

a screen output unit which outputs the screen configured by the screen configuration unit;

a specifying information receiving unit which receives the synchronization specifying information on each command through the screen outputted by the screen output unit; and a command execution unit which executes the stored commands according to the process sequence so as to execute a command specified to be synchronously executed after an execution end of an immediately previous command and a command specified to be asynchronously executed without waiting for an execution end of an immediately previous command with reference to the synchronization specifying information received by the specifying information receiving unit.

* * * * *

UNITED STATES PATENT AND TRADEMARK OFFICE
CERTIFICATE OF CORRECTION

PATENT NO. : 8,396,580 B2  
APPLICATION NO. : 12/865222  
DATED : March 12, 2013  
INVENTOR(S) : Masaru Nishimura Page 1 of 1

It is certified that error appears in the above-identified patent and that said Letters Patent is hereby corrected as shown below:

In the specification, column 11, line 13, please add – "[command]" – after "example,"

Signed and Sealed this  
Ninth Day of July, 2013

Teresa Stanek Rea  
*Acting Director of the United States Patent and Trademark Office*